(12) United States Patent
Schlesener et al.

(10) Patent No.: US 9,182,677 B2
(45) Date of Patent: Nov. 10, 2015

(54) OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventors: Frank Schlesener, Oberkochen (DE); Ingo Saenger, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/468,646

(22) Filed: Aug. 26, 2014

(65) Prior Publication Data

US 2015/0029480 A1   Jan. 29, 2015

Related U.S. Application Data

(63) Continuation of application No. PCT/EP2013/054202, filed on Mar. 1, 2013.

(60) Provisional application No. 61/617,130, filed on Mar. 29, 2012.

(30) Foreign Application Priority Data

Mar. 29, 2012   (DE) .......................... 10 2012 205 045

(51) Int. Cl.
  *G02B 27/54*   (2006.01)
  *G03F 7/20*   (2006.01)
  *G02B 5/30*   (2006.01)

(52) U.S. Cl.
  CPC .......... *G03F 7/70191* (2013.01); *G02B 5/3083* (2013.01); *G03F 7/70116* (2013.01); *G03F 7/70566* (2013.01); *G03F 7/70966* (2013.01)

(58) Field of Classification Search
  CPC ............ G03F 7/70191; G03F 7/70116; G03F 7/70966; G03F 7/70566

USPC ............................ 355/53, 67, 71; 359/489.07
See application file for complete search history.

(56) References Cited

U.S. PATENT DOCUMENTS

| 5,744,721 A | 4/1998 | Varnum |
| 5,886,810 A | 3/1999 | Siahpoushan et al. |

(Continued)

FOREIGN PATENT DOCUMENTS

| DE | 10 2004 011 733 A1 | 9/2005 |
| DE | 10 2008 009 601 A1 | 8/2009 |

(Continued)

OTHER PUBLICATIONS

International Search Report for PCT Appl No. PCT/EP2013/054202, dated Jun. 6, 2013.

(Continued)

*Primary Examiner* — Hung Henry Nguyen
(74) *Attorney, Agent, or Firm* — Fish & Richardson P.C.

(57) ABSTRACT

An optical system of a microlithographic projection exposure apparatus comprises at least one mirror arrangement, having a plurality of mirror elements which are adjustable independently of one another for varying an angular distribution of the light reflected by the mirror arrangement, a polarization-influencing optical arrangement, by which, for a light beam passing through during the operation of the projection exposure apparatus, different polarization states can be set via the light beam cross section, and a retarder arrangement, which is arranged upstream of the polarization-influencing optical arrangement in the light propagation direction and at least partly compensates for a disturbance of the polarization distribution that is present elsewhere in the projection exposure apparatus, wherein the polarization-influencing optical arrangement has optical components which are adjustable in their relative position with respect to one another, wherein different output polarization distributions can be produced by this adjustment in conjunction with the mirror arrangement.

25 Claims, 13 Drawing Sheets

(56) References Cited

U.S. PATENT DOCUMENTS

| | | | |
|---|---|---|---|
| 6,191,880 | B1 | 2/2001 | Schuster |
| 7,411,656 | B2* | 8/2008 | Totzeck et al. ............. 355/71 |
| 2006/0077370 | A1 | 4/2006 | Mulkens et al. |
| 2007/0146676 | A1 | 6/2007 | Tanitsu et al. |
| 2007/0279613 | A1 | 12/2007 | Fiolka et al. |
| 2009/0174877 | A1 | 7/2009 | Mulder et al. |
| 2009/0213345 | A1 | 8/2009 | Mann |
| 2011/0063597 | A1* | 3/2011 | Mengel ....................... 355/71 |
| 2011/0228247 | A1 | 9/2011 | Mulder et al. |
| 2013/0050673 | A1 | 2/2013 | Saenger et al. |
| 2013/0077077 | A1 | 3/2013 | Saenger et al. |

FOREIGN PATENT DOCUMENTS

| | | |
|---|---|---|
| DE | 10 2010 029 339 A1 | 12/2011 |
| DE | 10 2010 029 905 A1 | 12/2011 |
| EP | 1 647 863 A2 | 4/2006 |
| EP | 2 369 413 A2 | 9/2011 |
| JP | 2006-114904 | 4/2006 |
| JP | 2011-199285 | 10/2011 |
| WO | WO 2005/026843 A2 | 3/2005 |
| WO | WO 2005/031467 A2 | 4/2005 |
| WO | WO 2005/069081 A2 | 7/2005 |
| WO | WO 2008/019936 A2 | 2/2008 |
| WO | WO 2009/034109 A2 | 3/2009 |
| WO | WO 2009/100862 A1 | 8/2009 |
| WO | WO 2013/143594 A1 | 10/2013 |

OTHER PUBLICATIONS

International Preliminary Report on Patentability for PCT/EP2013/054202, dated Oct. 9, 2014.

German Office Action, with translation thereof, for DE Appl No. 10 2012 205 045.0, dated Nov. 21, 2012.

Japanese Office Action with English translation thereof, for corresponding JP Appln. No. 2015-502173, dated Jun. 18, 2015.

* cited by examiner

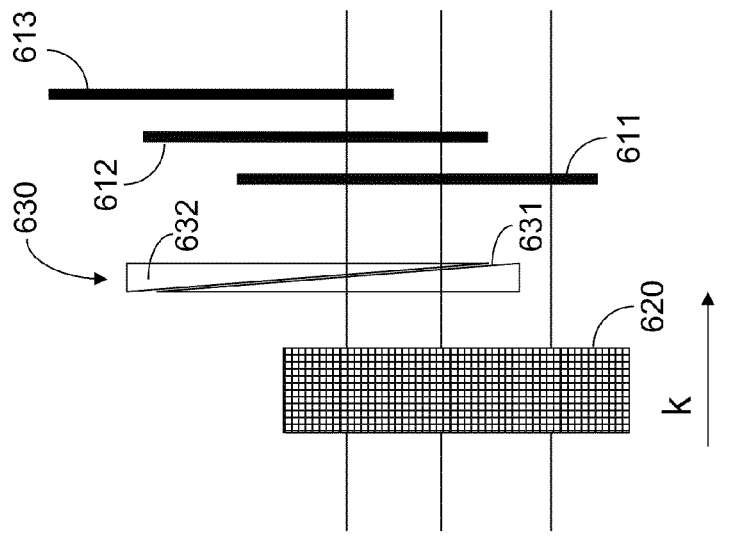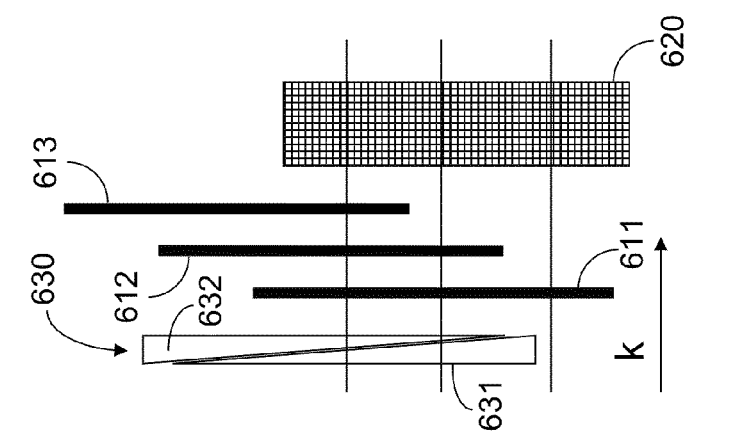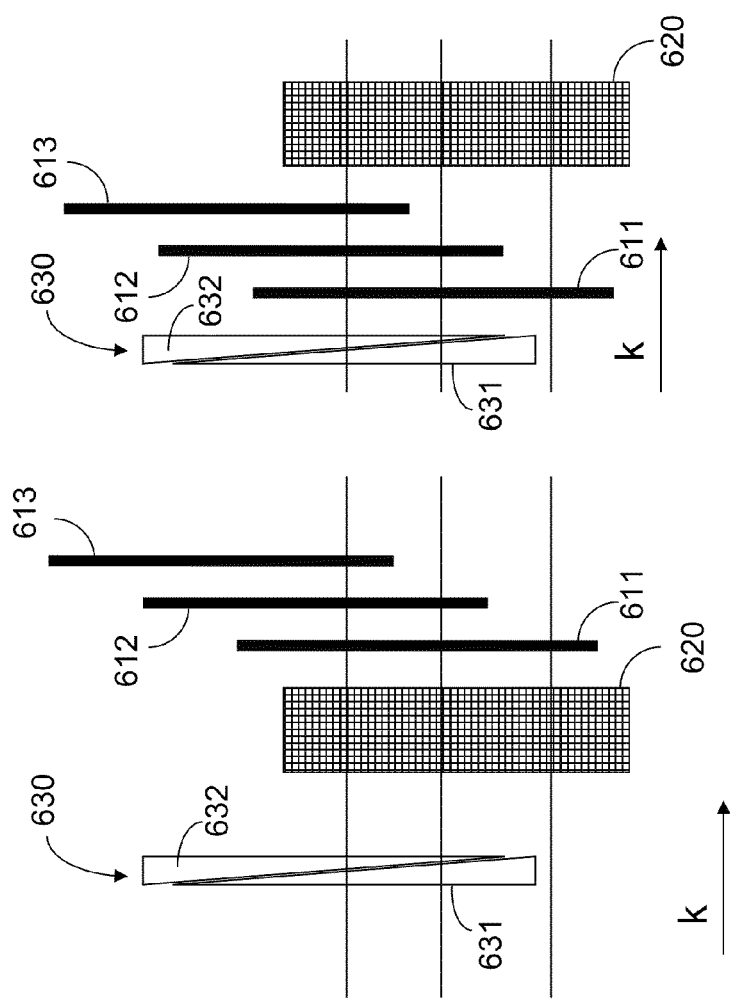

OPTICAL SYSTEM OF A MICROLITHOGRAPHIC PROJECTION EXPOSURE APPARATUS

CROSS REFERENCE TO RELATED APPLICATIONS

The present application is a continuation of, and claims benefit under 35 USC 120 to, international application PCT/EP2013/054202, filed Mar. 1, 2013, which claims benefit under 35 USC 119 of German Application No. 10 2012 205 045.0, filed Mar. 29, 2012. International application PCT/EP2013/054202 also claims priority under 35 USC 119(e) to U.S. Provisional Application No. 61/617,130, filed Mar. 29, 2012. The content of each of these applications is hereby incorporated by reference.

BACKGROUND OF THE INVENTION

1. Field of the Invention

The invention relates to an optical system of a microlithographic projection exposure apparatus. In particular, the invention relates to an optical system of a microlithographic projection exposure apparatus which makes possible, for different polarization distributions, an effective compensation of an undesirable system retardation with comparatively little complexity.

2. Prior Art

Microlithography is used for producing microstructured components, such as, for example, integrated circuits or LCDs. The microlithography process is carried out in a so-called projection exposure apparatus comprising an illumination device and a projection lens. In this case, the image of a mask (=reticle) illuminated via the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

During the operation of a microlithographic projection exposure apparatus, there is a need to set defined illumination settings, i.e. intensity distributions in a pupil plane of the illumination device, in a targeted manner. Alongside the use of diffractive optical elements (so-called DOEs), the use of mirror arrangements is also known for this purpose, e.g. from WO 2005/026843 A2. Such mirror arrangements comprise a multiplicity of micromirrors that can be set independently of one another.

Various approaches are furthermore known for setting specific polarization distributions in the pupil plane and/or in the reticle in a targeted manner in the illumination device for the purpose of optimizing the imaging contrast. In particular, it is known, both in the illumination device and in the projection lens, to set a tangential polarization distribution for high-contrast imaging. "Tangential polarization" (or "TE polarization") is understood to mean a polarization distribution for which the oscillation planes of the electric field strength vectors of the individual linearly polarized light rays are oriented approximately perpendicularly to the radius directed to the optical system axis. By contrast, "radial polarization" (or "TM polarization") is understood to mean a polarization distribution for which the oscillation planes of the electric field strength vectors of the individual linearly polarized light rays are oriented approximately radially with respect to the optical system axis.

With regard to the prior art, reference is made by way of example to WO 2005/069081 A2, WO 2005/031467 A2, U.S. Pat. No. 6,191,880 B1, US 2007/0146676 A1, WO 2009/034109 A2, WO 2008/019936 A2, WO 2009/100862 A1, DE 10 2008 009 601 A1 and DE 10 2004 011 733 A1.

During the operation of a projection exposure apparatus, the problem occurs, inter alia, that on account of birefringence occurring in the material of the optical components such as e.g. lens elements (e.g. intrinsic birefringence in calcium fluoride), stress birefringence (owing to mounts or material stresses in the production process) or layer birefringence, an undesirable system retardation occurs which results in a reduction of the so-called IPS value (i.e. the "Intensity in Preferred State"). "Retardation" is understood to mean the difference in the optical path lengths of two orthogonal (i.e. mutually perpendicular) polarization states.

Compensation of this system retardation for the purpose of increasing the IPS value can prove to be complex in this case in so far as the retardation has a vectorial character in so far as light rays having mutually different polarization states effectively experience different retardations, the system retardation moreover having a comparatively pronounced field and pupil dependence.

SUMMARY OF THE INVENTION

It is an object of the present invention to provide an optical system of a microlithographic projection exposure apparatus which makes possible, in a flexible manner or for different polarization distributions, an effective compensation of the above-described system retardation with comparatively little complexity.

This object is achieved via the optical system of a microlithographic projection exposure apparatus. The optical system includes: at least one mirror arrangement, having a plurality of mirror elements which are adjustable independently of one another for varying an angular distribution of the light reflected by the mirror arrangement; a polarization influencing optical arrangement by which, for a light beam passing through during the operation of the projection exposure apparatus, different polarization states can be set via the light beam cross section; and a retarder arrangement, which is arranged upstream of the polarization influencing optical arrangement in the light propagation direction and at least partly compensates for a disturbance of the polarization distribution that is present elsewhere in the projection exposure apparatus. The polarization influencing optical arrangement has optical components which are adjustable in their relative position with respect to one another. Different output polarization distributions can be produced by this adjustment in conjunction with the mirror arrangement.

An optical system of a microlithographic projection exposure apparatus comprises:
- at least one mirror arrangement, having a plurality of mirror elements which are adjustable independently of one another for varying an angular distribution of the light reflected by the mirror arrangement;
- a polarization-influencing optical arrangement, via which, for a light beam passing through during the operation of the projection exposure apparatus, different polarization states can be set via the light beam cross section; and
- a retarder arrangement, which is arranged upstream of the polarization-influencing optical arrangement in the light propagation direction and at least partly compensates for a disturbance of the polarization distribution that is present elsewhere in the projection exposure apparatus;
- wherein the polarization-influencing optical arrangement has optical components which are adjustable in their relative position with respect to one another, wherein different output polarization distributions can be produced by this adjustment in conjunction with the mirror arrangement.

The present invention is based on the concept, in particular, that, in an optical system comprising a mirror arrangement in combination with a polarization-influencing optical arrangement for flexibly producing different intensity and polarization distributions, a retarder arrangement serving to compensate for undesirable system retardation is positioned actually before the polarization-influencing optical arrangement in the light propagation direction (i.e. upstream of the polarization-influencing optical arrangement). This has the consequence that an ellipticity of the polarization state that is introduced by the retarder arrangement e.g. for originally linearly polarized light (and is produced by the linear birefringence of the retarder arrangement) is likewise influenced with regard to the polarization state by the polarization-influencing optical arrangement succeeding the retarder arrangement or situated downstream thereof in the light propagation direction, to be precise likewise in a manner that differs over the light beam cross section.

Thus, for instance for the case where the polarization-influencing optical arrangement provides different polarization rotation angles of the preferred direction of polarization across the light beam cross section of light passing through, the ellipticity produced by the retarder arrangement according to the invention is concomitantly rotated in accordance with the polarization rotation angles, which in turn has the consequence that the relevant ellipticity, depending on the polarization state (or polarization rotation angle) of the corresponding light components, can contribute to the effective compensation of the undesirable system retardation. The polarization rotation on account of the polarization-influencing optical arrangement corresponds in this respect to a rotation of the major axis of the elliptical component introduced by the retarder arrangement, wherein the polarization ellipticity itself (that is to say the retardation) is maintained and can be used in each case to compensate for the disturbing or undesirable system retardation.

The positioning of the retarder arrangement according to the invention upstream of the polarization-influencing optical arrangement in this case has the advantage, in particular, that the use of a multiplicity of different components of the retarder arrangement for the different polarization states produced by the polarization-influencing optical arrangement is dispensable. This is because the different polarization states or different polarization rotation angles are produced only after passing through the retarder arrangement according to the invention, in which case, as described above, the elliptically polarized component produced by the retarder arrangement and required for the compensation of the system retardation is concomitantly rotated by the polarization-influencing optical arrangement.

In accordance with the disclosure, the polarization-influencing optical arrangement has optical components which are adjustable in their relative position with respect to one another, wherein different output polarization distributions can be produced by this adjustment in conjunction with the mirror arrangement. Therefore, in particular, a degree of overlap that is variable in the light propagation direction can be settable for the optical components.

In embodiments of the invention, the optical components of the polarization-influencing optical arrangement can be lambda/2 plates. This configuration is based on the functional principle of providing, by using at least two lambda/2 plates in combination with a mirror arrangement, regions which, upon passage of light, depending on whether the passage takes place through only one of the lambda/2 plates, through both lambda/2 plates or through none of the lambda/2 plates, in conjunction with the mirror arrangement have different output polarization distributions. In this way, via the use of two lambda/2 plates, it is possible to produce four different polarization states with freely selectable light or intensity components. In this case, the adjustability of the lambda/2 plates in their relative position with respect to one another can comprise a translational movement of at least one of the lambda/2 plates and/or a rotation of at least one of the lambda/2 plates. Furthermore, the lambda/2 plates can have mutually different orientations of the fast axis of birefringence, wherein, in particular, the fast axes can be arranged at an angle of 45°±5° with respect to one another. Furthermore, the lambda/2 plates can form a 90° rotator (which brings about an effective rotation of the preferred direction of polarization of light passing through by 90°) in the region of the overlap with one another.

In further embodiments of the invention, the optical components of the polarization-influencing optical arrangement can also be produced, as will be explained in even greater detail below, from optically active material, in particular from crystalline quartz having an orientation of the optical crystal axis that is parallel to the light propagation direction.

In accordance with one embodiment of the invention, the retarder arrangement is adjustable for the variation of the retardation provided. The adjustability can comprise, in particular, the displacability of at least one component of the retarder arrangement within a plane perpendicular to the light propagation direction, in particular in two mutually perpendicular directions in the plane. Owing to this displacability, the degree of coverage of the mirror elements by the optical components of the retarder arrangement can be varied dynamically, wherein the retarder arrangement produces a retardation only in those mirror elements of the mirror arrangement which are covered by the retarder arrangement.

In accordance with a further embodiment, the adjustability of the retarder arrangement comprises the rotatability of a component of the retarder arrangement about a rotation axis parallel to the light propagation direction. This configuration is based on the functional principle that, via the rotation of the fast axis of the retarder arrangement in the case of a fixed direction of polarization of the impinging light, the effective birefringence or the magnitude of the retardation produced by the retarder arrangement can likewise be varied (wherein e.g. in the case of parallel orientation of the fast axis with respect to the direction of polarization no effective birefringence occurs, whereas the effective birefringence becomes maximal if the fast axis is at an angle of 45° with respect to the direction of polarization).

In accordance with one embodiment of the invention, the variation of the retardation provided by the retarder arrangement comprises a variation of the sign of the retardation. In other words, both positive and negative retardations can be realized by reversing the direction of rotation of the elliptical polarization respectively produced via the retarder arrangement. This takes account of the circumstance that in a typical, both field- and pupil-dependent retardation distribution of the optical system, both positive and negative retardations have to be kept available for individual pupil regions.

In accordance with one embodiment, the retarder arrangement has two retarders, which are movable independently of one another within a plane perpendicular to the light propagation direction, in particular in two mutually perpendicular directions in the plane.

The retarder arrangement can have, in particular, at least one plane-parallel plate.

In accordance with one embodiment, the retarder arrangement has at least one element in the form of a wedge section.

In accordance with one embodiment, the retarder arrangement has at least one double wedge arrangement composed of two wedge elements, which are displaceable relative to one another for the variation of the effective thickness of the double wedge arrangement. In this case, by displacing the wedge elements relative to one another, it is possible to vary the effective thickness of the double wedge arrangement and thus the absolute value of the retardation produced, in a manner dependent on the system retardation to be compensated for.

In accordance with a further embodiment, the retarder arrangement has a photoelastic modulator as a switchable element, in order to make it possible to set the absolute value of the retardation provided.

The invention furthermore relates to a microlithographic projection exposure apparatus and to a method for microlithographically producing microstructured components.

Further configurations of the invention can be gathered from the description and the dependent claims.

The invention is explained in greater detail below on the basis of exemplary embodiments illustrated in the accompanying drawings.

DETAILED DESCRIPTION OF PREFERRED EMBODIMENTS

Firstly, with reference to FIG. 11, a basic construction of a microlithographic projection exposure apparatus comprising an optical system according to the invention is explained below. The projection exposure apparatus has an illumination device 10 and a projection lens 20. The illumination device 10 serves for illuminating a structure-bearing mask (reticle) 30 with light from a light source unit 1, which comprises, for example, an ArF excimer laser for an operating wavelength of 193 nm and a beam shaping optical unit, which generates a parallel light beam. Generally, the illumination device 10 and the projection lens 20 are preferably designed for an operating wavelength of less than 400 nm, in particular less than 250 nm, more particularly less than 200 nm.

Figure 1A:
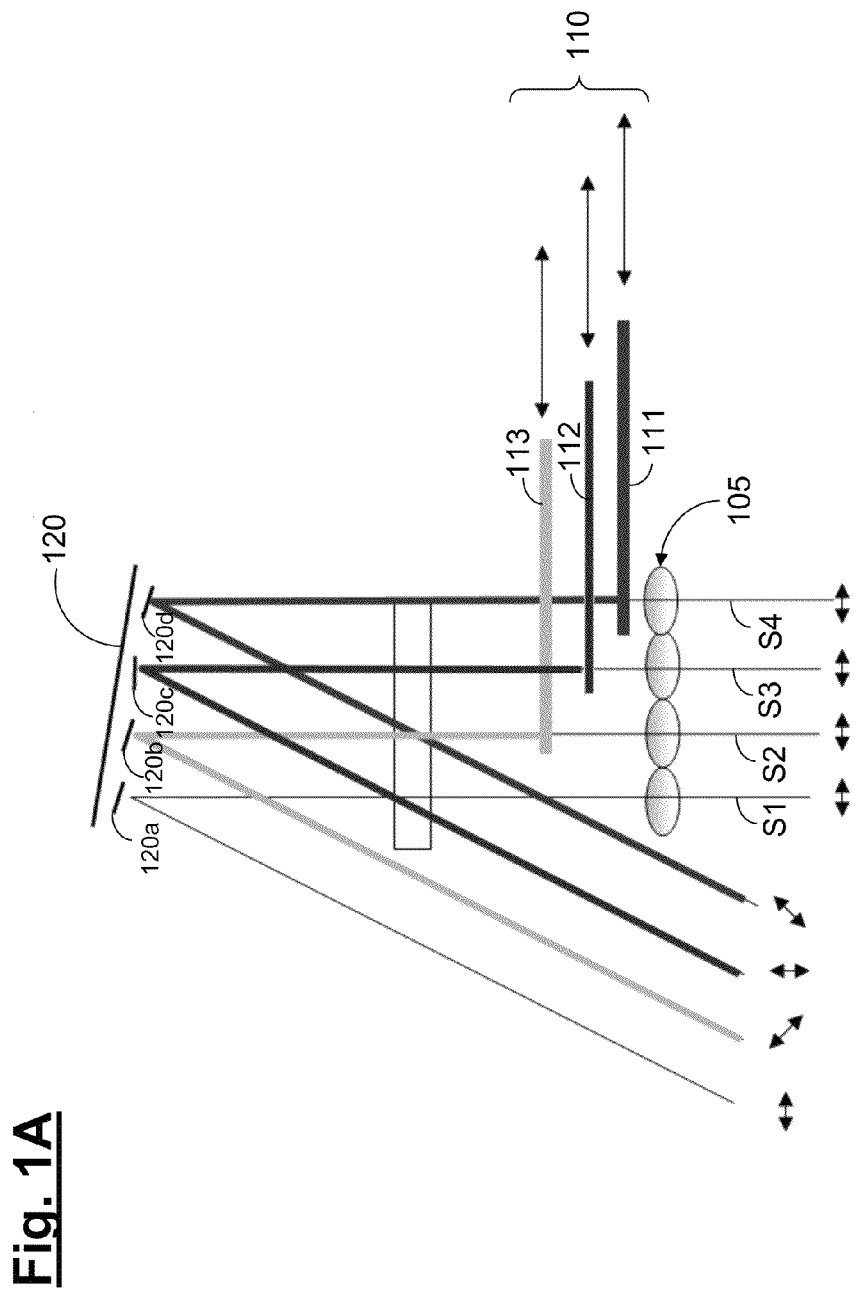
FIGS. 1A-1B; 2A-2B; 3A-3B; 4A-4B; 5A-5B; 6A-6C; 7A-7B-10 show schematic illustrations for elucidating different embodiments of the invention.
Figure 1B:
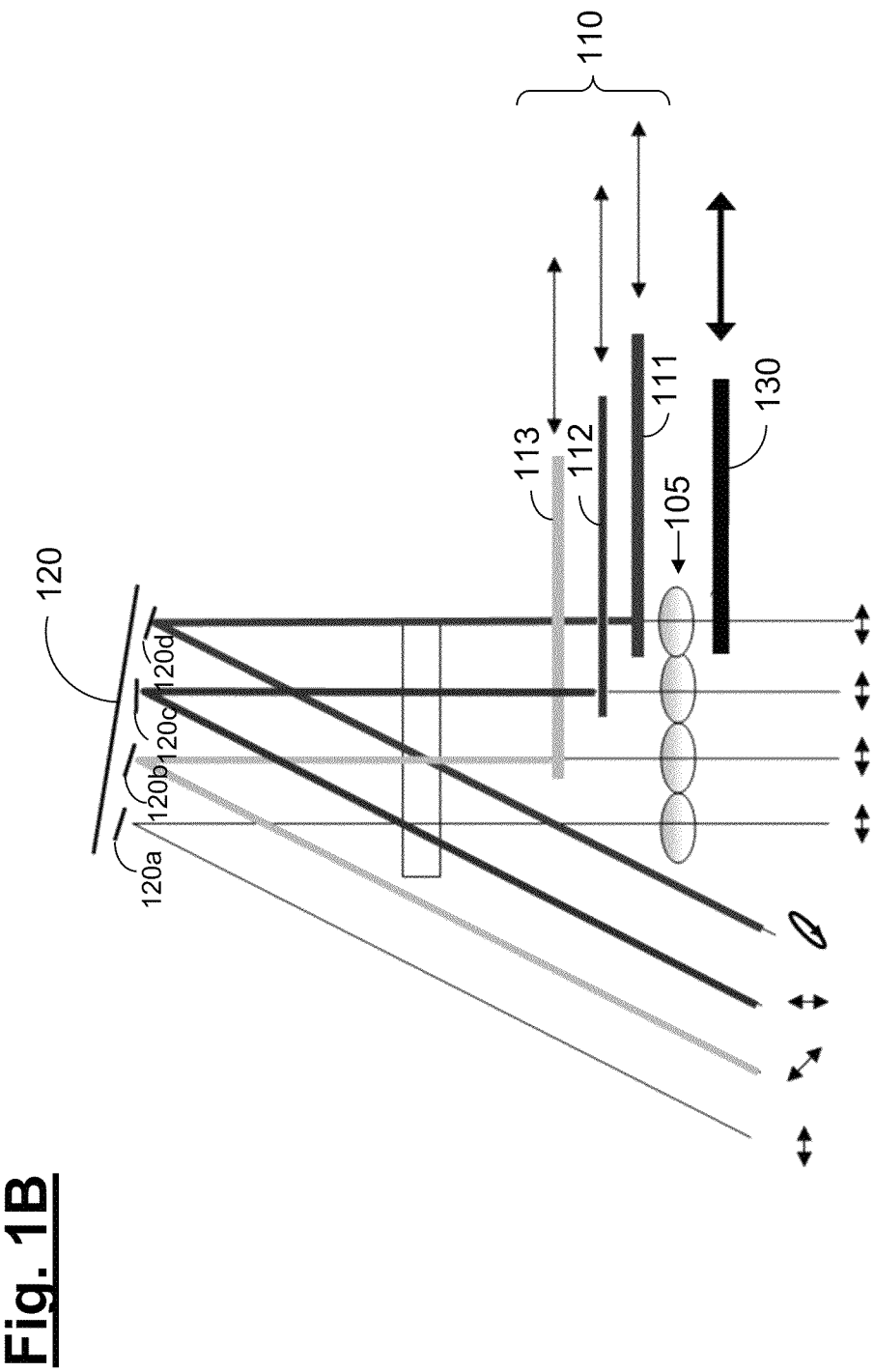

According to the invention, part of the illumination device 10 is in particular, a mirror arrangement 120 having a multiplicity of mirror elements that can be set independently of one another. A polarization-influencing optical arrangement 110, explained in even greater detail below with reference to FIGS. 1A-1B, is arranged upstream of the mirror arrangement 120 in the light propagation direction. Furthermore, a retarder arrangement 130 is situated upstream of the polarization-influencing optical arrangement 110 in the light propagation direction. In accordance with FIGS. 1A-1B, provision is furthermore made of driving units 115, 125 and 135, which are assigned to the polarization-influencing optical arrangement 110, the mirror arrangement 120 and the retarder arrangement 130, respectively, and in each case make possible the adjustment thereof via suitable actuators. Actuators for adjusting the arrangements can be configured in any desired manner, e.g. as belt drives, flexure elements, piezo-actuators, linear drives, direct-current (DC) motors with or without gearing, spindle drives, toothed belt drives, gearwheel drives or combinations of these known components.

The illumination device 10 has an optical unit 11, which comprises a deflection mirror 12, inter alia, in the example illustrated. A light mixing device (not illustrated) is situated in the beam path downstream of the optical unit 11 in the light propagation direction, which light mixing device can have, for example, in a manner known per se, an arrangement of micro-optical elements that is suitable for achieving light mixing, and also a lens element group 14, downstream of which is situated a field plane with a reticle masking system (REMA), which is imaged by a REMA lens 15 disposed downstream in the light propagation direction onto the structure-bearing mask (reticle) 30 arranged in a further field plane and thereby delimits the illuminated region on the reticle. The structure-bearing mask 30 is imaged by the projection lens 20 onto a substrate 40, or a wafer, provided with a light-sensitive layer. The projection lens 20 can be designed, in particular, for immersion operation. Furthermore, it can have a numerical aperture NA of greater than 0.85, in particular greater than 1.1.

The mirror arrangement 120 has a plurality of mirror elements 120a, 120b, 120c, ... in accordance with FIGS. 1A, 1B. The mirror elements 120a, 120b, 120c, ... are adjustable independently of one another for varying an angular distribution of the light reflected by the mirror arrangement 120, the driving unit 125 serving for this purpose in accordance with FIG. 11. In the exemplary embodiment, a microlens element arrangement 105, which is not shown in FIG. 11 but is indicated schematically in FIGS. 1A, 1B, is also situated upstream of the mirror arrangement 120 in the light propagation direction, the microlens element arrangement having a multiplicity of microlens elements for targeted focusing onto the mirror elements of the mirror arrangement and for reducing or avoiding an illumination of "dead surface area". The mirror elements 120a, 120b, 120c, ... can in each case be tilted individually, e.g. in an angular range of $-2°$ to $+2°$, in particular $-5°$ to $+5°$, more particularly $-10°$ to $+10°$. Via a suitable tilting arrangement of the mirror elements 120a, 120b, 120c, ... in the mirror arrangement 120, a desired light distribution, e.g. an annular illumination setting or else a dipole setting or a quadrupole setting, can be formed in the pupil plane PP by virtue of the previously homogenized and collimated laser light being directed respectively in the corresponding direction by the mirror elements 120a, 120b, 120c, ... depending on the desired illumination setting.

Firstly, the concept according to the invention is explained below on the basis of an embodiment and with reference to the schematic illustrations in FIGS. 1A, 1B.

Figure 11:
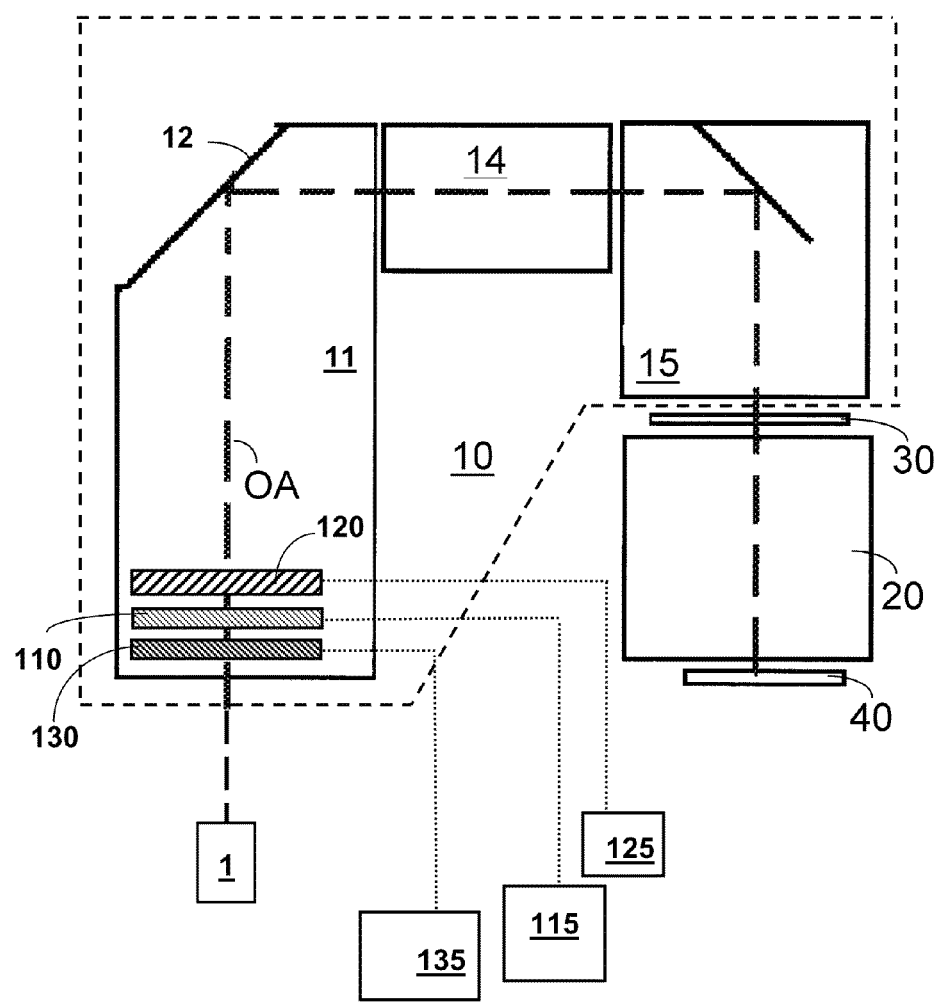
FIG. 11 shows a schematic illustration for elucidating the construction of a microlithographic projection exposure apparatus with an optical system according to the invention.

FIG. 1A serves firstly to elucidate the interaction of the polarization-influencing optical arrangement 110, already mentioned in connection with FIG. 11, with the mirror arrangement 120. In this case, the polarization-influencing optical arrangement 110 has three mutually independently adjustable components in the form of optical rotators composed of optically active crystalline quartz, which components can be introduced into the beam path in each case perpendicularly to the light propagation direction, wherein each of the rotators by itself brings about a rotation of the preferred direction of polarization by 45° for light passing through. Consequently, the preferred direction of polarization is rotated by 45° upon passage of light through only one rotator 111, 112 or 113, by 90° upon passing through two of the rotators 111-113, and by 135° (or −45°) upon passing through all of the rotators 111-113. This situation is illustrated in FIG. 1A, wherein the double-headed arrows depicted for the partial beams S1-S4 respectively designate the preferred direction of polarization as seen in the z-direction (when viewed in the x-y plane). In this case, the partial beam S1 passes through none of the rotators 111-113, and so the preferred direction of polarization (which corresponds to the x-direction in the example) remains unchanged for this partial beam.

FIG. 1A likewise illustrates only schematically the microlens element arrangement 105, which, as mentioned above, focuses the individual partial beams respectively onto mirror elements 120a, 120b, 120c, 120d, . . . of the mirror arrangement 120. The positioning of the microlens element arrangement 105 is merely by way of example, wherein, in further exemplary embodiments, the microlens element arrangement 105 can also be arranged after the polarization-influencing optical arrangement 110 or downstream thereof in the light propagation direction.

The partial beams S1-S4 provided with different preferred directions of polarization on account of the construction from FIG. 1A then experience, upon further passage through the illumination system 10 (from FIG. 11), different retardations owing to the system retardation described initially (and brought about e.g. by birefringence in the lens element material, stress birefringence, etc.). In order to compensate for this undesirable system retardation, according to the invention, as can be seen from FIG. 1B, a retarder arrangement 130 is now introduced into the beam path, the retarder arrangement 130 being introduced in this way before the polarization-influencing optical arrangement 110 (i.e. upstream thereof) in the light propagation direction.

The retarder arrangement 130 can, as will be explained below with reference to FIGS. 3A-3B, be configured in different ways and, in the simplest case, can be configured as a plane-parallel plate composed of linearly birefringent material, e.g. magnesium fluoride ($MgF_2$), sapphire ($Al_2O_3$) or crystalline quartz having an orientation of the optical crystal axis that is perpendicular to the light propagation direction. This linearly birefringent, plane-parallel plate can be configured e.g. such that it produces a retardation of e.g. 10 nm for light passing through, wherein this retardation introduces a polarization ellipticity for the light which impinges on the plane-parallel plate or the retarder arrangement 130 and which is originally linearly polarized in the x-direction.

Owing to the positioning according to the invention of the retarder arrangement 130 upstream of the polarization-influencing optical arrangement 110, the polarization ellipticity (or the major axis of the respective ellipse) is now "concomitantly rotated" by the components or rotators of the polarization-influencing optical arrangement 110 through which the respective partial beam respectively passes, wherein the extent of this rotation, as already in the scenario from FIG. 1A, is dependent on how many of the components or rotators 111-113 are passed through. Consequently, the elliptical polarization rotated in the manner described above can also be used to compensate for the undesirable system retardation.

Figure 2A:
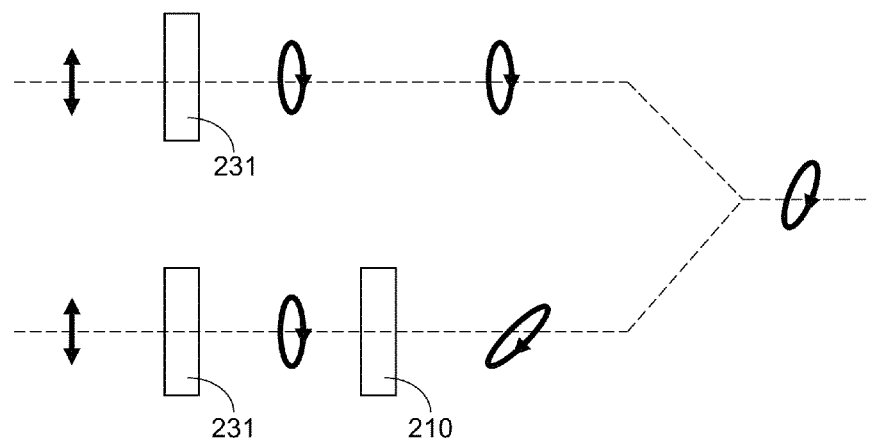
Figure 2B:
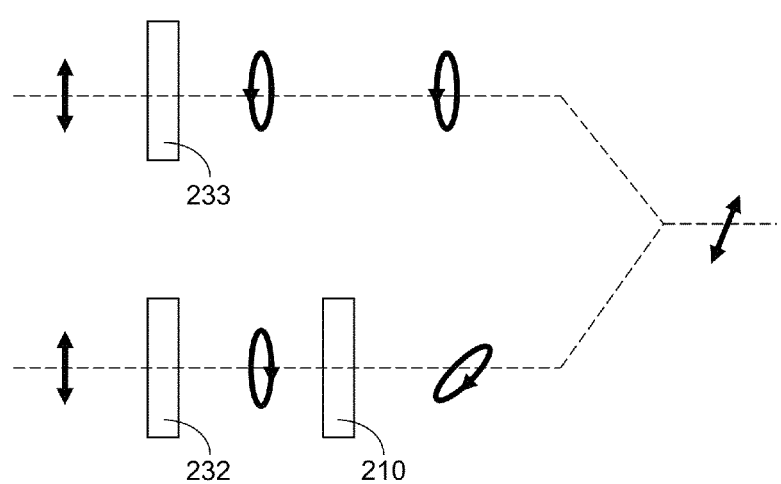

As indicated in FIGS. 2A-2B, the retardation introduced by the retarder arrangement according to the invention, or the polarization ellipticity associated therewith, can also be used to compensate for the system retardation if spots having different polarization states are superimposed in the illumination device. If two Stokes vectors $S_1$ and $S_2$ are considered, which on account of the abovementioned compensators experience the retardations $Ret_i$ (i=1, 2) and—owing to the polarization-influencing optical arrangement—have different polarization rotations, i.e.

$$S_1 = \begin{pmatrix} 1 \\ \cos(2\varphi_1) \\ -\sin(2\varphi_1) \\ Ret_1 \end{pmatrix}, S_2 = \begin{pmatrix} 1 \\ \cos(2\varphi_2) \\ -\sin(2\varphi_2) \\ Ret_2 \end{pmatrix}, \quad (1)$$

then the following arises if two mirror elements of the mirror arrangement having the properties described are superimposed:

$$S_{tot} = S_1 + S_2 = \begin{pmatrix} 2 \\ \cos(2\varphi_1) + \cos(2\varphi_2) \\ -\sin(2\varphi_1) - \sin(2\varphi_2) \\ Ret_1 + Ret_2 \end{pmatrix} \quad (2)$$

In this case, it becomes clear that the retardation introduced by the retarder arrangement is also effective in the case of the polarization rotation produced via spot superimposition of different mirror elements of the mirror arrangement. It is thus also possible to correct the system retardation in the case of rotated polarization states.

Further embodiments of the retarder arrangement according to the invention are explained below with reference to FIGS. 3A-3B.

Figure 3A:
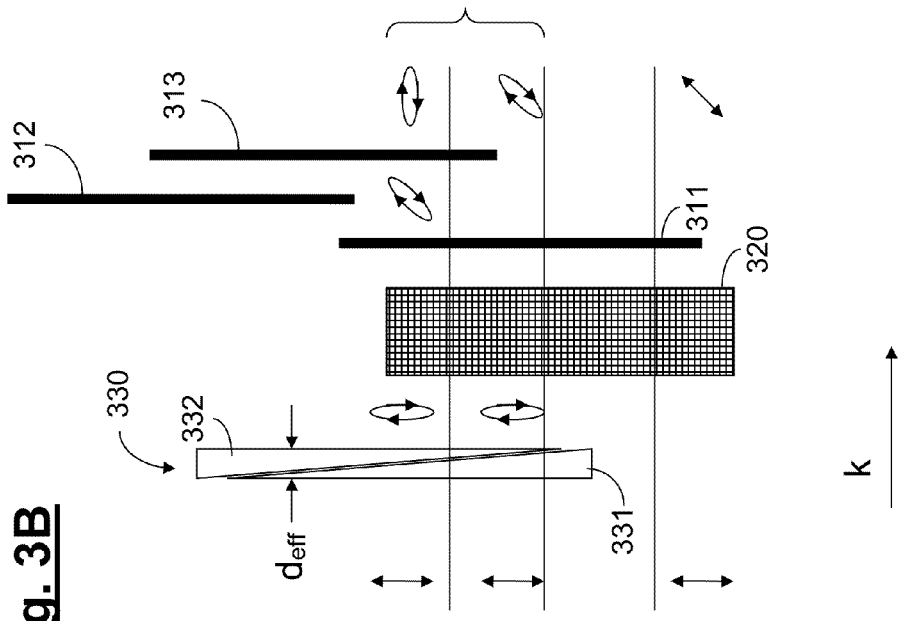
Figure 3B:
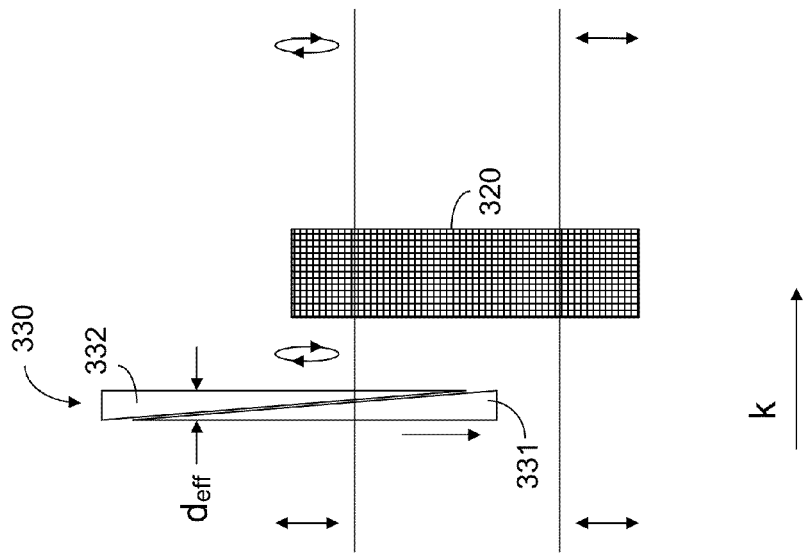

FIGS. 3A, 3B firstly show the possible configuration of a retarder arrangement 330 as a double wedge arrangement composed of two wedge elements 331, 332 that can be displaced relative to one another for the variation of the effective thickness. In this case, the wedge elements 331 and 332 are each once again produced from linearly birefringent material having an orientation of the optical crystal axis that is perpendicular to the light propagation direction, wherein the orientations of the crystal axes correspond in both wedge elements 331. It goes without saying that each of the wedge elements can also be embodied merely as a wedge section (i.e. without the section tapering to a point).

In FIGS. 3A, 3B, the direction of polarization of the incident linearly polarized light is once again symbolized via the double-headed arrows, wherein those partial beams which pass through the double wedge introduced into the beam path are converted into an elliptically polarized state owing to the retardation effected by the double wedge. As can be seen from FIG. 3B, as a result of the introduction of the rotators or components of the polarization-influencing optical arrangement 310, this polarization ellipticity, which corresponds to the retardation kept available for compensating for the undesirable system retardation, is then concomitantly rotated, depending on which of the components or rotators 311-313 are passed through. In this case, the absolute value of the retardation produced by the double wedge arrangement forming the retarder arrangement 330 can be set in a variable manner by variation of the effective thickness $d_{eff}$ in order to be able to perform an adaptation to the magnitude of the system retardation to be compensated for. If the range of the effective thicknesses that can be set via the double wedge arrangement is chosen with an appropriate magnitude, the retardation that can be set or is kept available can assume e.g. values of 0 to $\lambda$ ($\lambda$=operating wavelength, e.g. approximately 193 nm). Furthermore, if necessary (depending on the sign of the system retardation to be compensated for) via the variation of the effective thickness of the double wedge arrangement, both positive and negative retardation can be set or kept available (i.e. it is possible to switch between generating left circularly elliptical and right circularly elliptical polarization states).

Figure 4B:
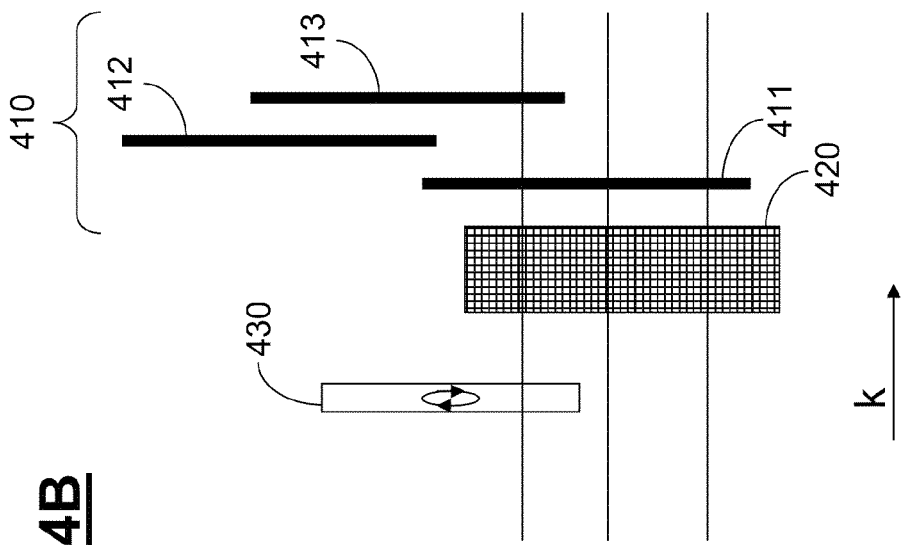
Figure 4A:
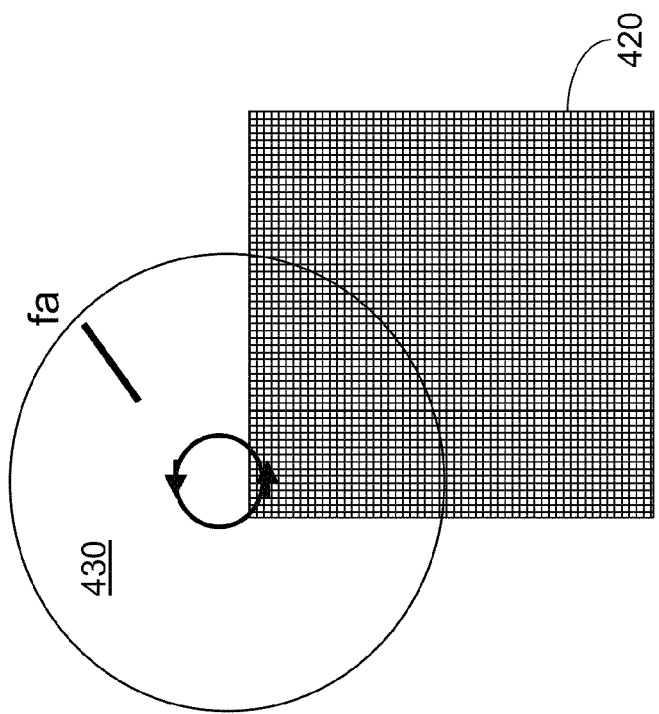

In accordance with FIGS. 4A, 4B, in a further embodiment, a retarder arrangement 430 can also be configured as a plane-parallel plate 430 rotatable about a rotation axis parallel to the light propagation direction (running in the z-direction), wherein the plate is once again configured from linearly birefringent material having an orientation of the optical crystal axis that is perpendicular to the light propagation direction. In FIG. 4A, the direction of rotation of the plate is symbolized by the arrow direction depicted, wherein the orientation of the fast axis of the birefringence is designated by "fa". Since, owing to the rotatability, the orientation of the fast axis is variable relative to the preferred direction of polarization of the impinging light, the magnitude of the retardation produced by the retarder arrangement 430 can effectively be varied (the retardation e.g. vanishing in the case of parallel orientation of fast axis and preferred direction of polarization and becoming maximal in the case of an angle of 45° between fast axis and preferred direction of polarization).

Figure 5B:
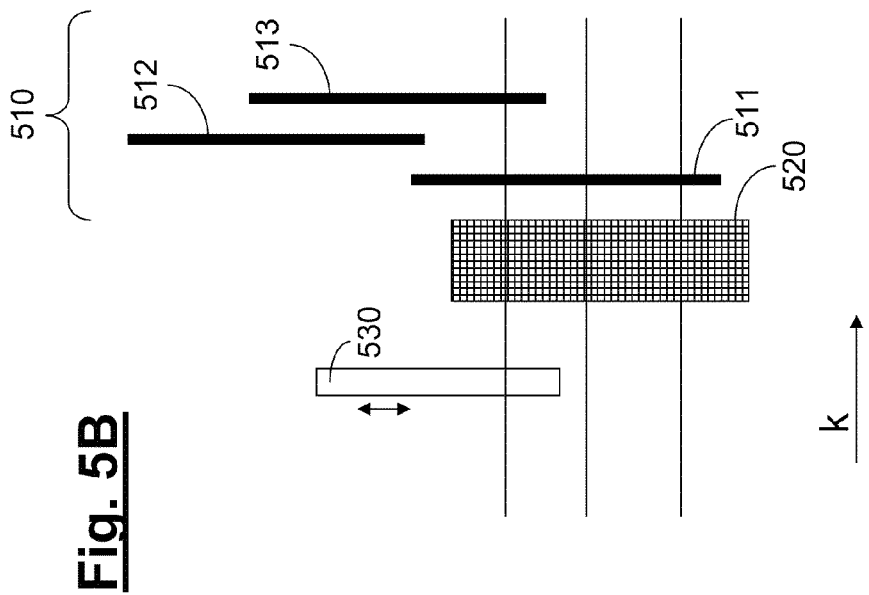
Figure 5A:
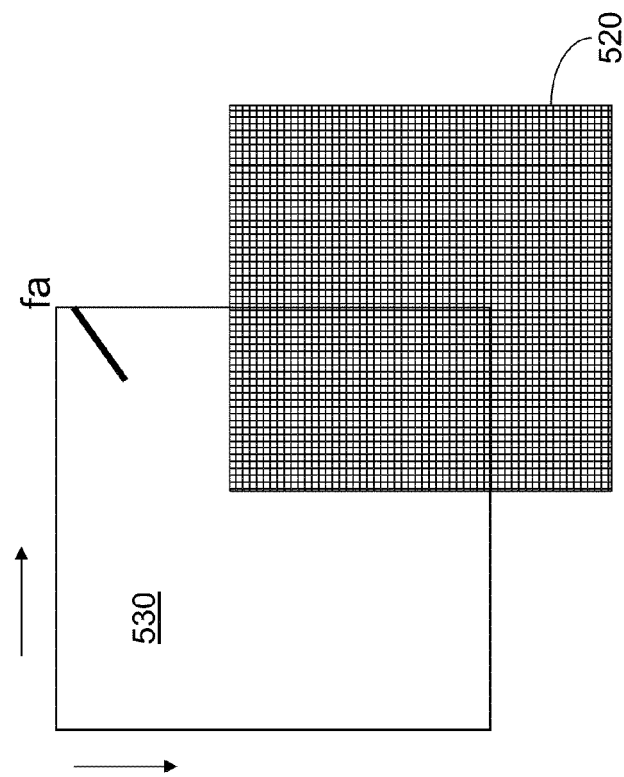

In accordance with FIGS. 5A, 5B, in further embodiments of the invention, a retarder arrangement 530 can also be configured such that it is displaceable in the x- and y-directions. Consequently, the degree of coverage of the mirror elements of the mirror arrangement 520 by the retarder arrangement 530 can be varied, which in turn has the consequence that the pupil portions or regions of the pupil plane in which the system retardation is intended to be compensated for can be varied dynamically.

As described above, it is of importance for the concept according to the invention that the retarder arrangement is arranged upstream of the polarization-influencing optical arrangement in the light propagation direction. Apart from this, however, the invention is not restricted to any further concrete order of the components "retarder arrangement", "polarization-influencing optical arrangement" and "mirror arrangement". Thus, in particular, as illustrated schematically in FIGS. 6A-6C, the mirror arrangement 620 can also be positioned between retarder arrangement 630 and polarization-influencing optical arrangement 610 (FIG. 6A), downstream of the retarder arrangement 630 and the polarization-influencing optical arrangement 610 in the light propagation direction (FIG. 6B) or upstream of the retarder arrangement 630 and the polarization-influencing optical arrangement 610 in the light propagation direction (FIG. 6C). In this case, care merely has to be taken to ensure that the light beams impinging on the individual mirror elements of the mirror arrangement 620 are not yet spatially superimposed on one another for different mirror segments, that is to say are still spatially separated from one another, in order that individual mirror elements of the mirror arrangement 620 can be selectively covered by the components of the polarization-influencing optical arrangement 610 (i.e. the plates 611-613 in FIGS. 6A-6C) and by the retarder arrangement 630.

Figure 7A:
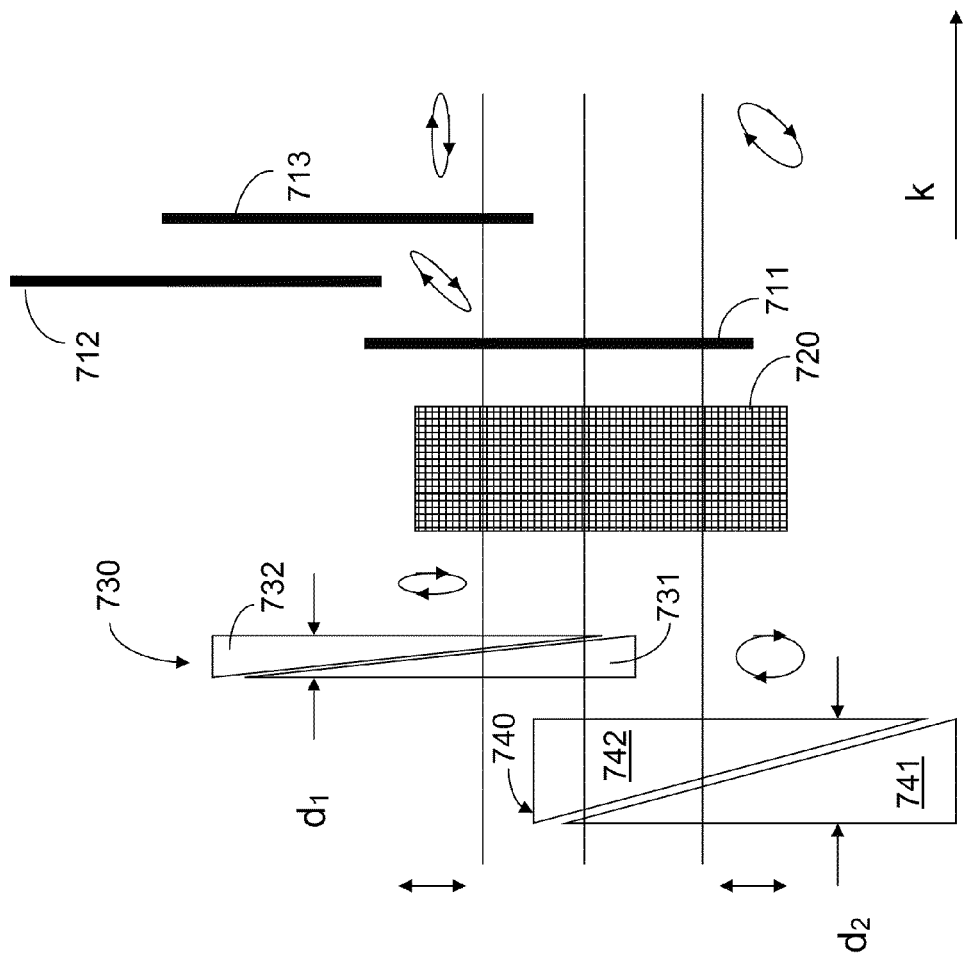
Figure 7B:
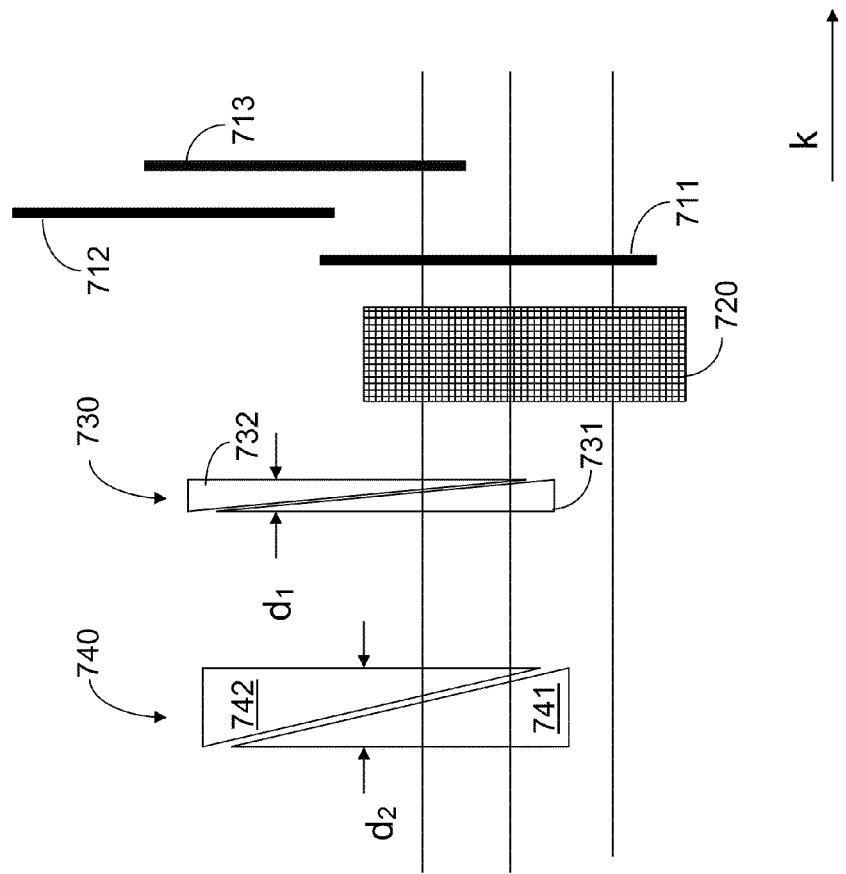

In a further embodiment, illustrated schematically with reference to FIGS. 7A, 7B, the retarder arrangement can also have not just one but two of the components described in different embodiments above with reference to FIGS. 1-6, for example two double wedge arrangements 730 and 740 in the exemplary embodiment in FIGS. 7A, 7B. In further embodiments, one or both of the double wedge arrangements can also be replaced by the retarder arrangements described above with reference to FIGS. 1-6 (that is to say e.g. also plane-parallel birefringence plates). These two components (that is to say the double wedge arrangements 730, 740 in accordance with FIGS. 7A, 7B), as indicated by the vertical double-headed arrows in FIG. 7A, are now in each case displaceable perpendicularly to the light propagation direction, such that (as shown by the comparison of FIG. 7A and FIG. 7B) different retardations can be set for different partial beams and thus pupil regions. In particular, retardations that correspond in terms of absolute value and have different signs can also be produced by the double wedge arrangements 730 and 740, depending on the effective thicknesses respectively set.

Figure 8:
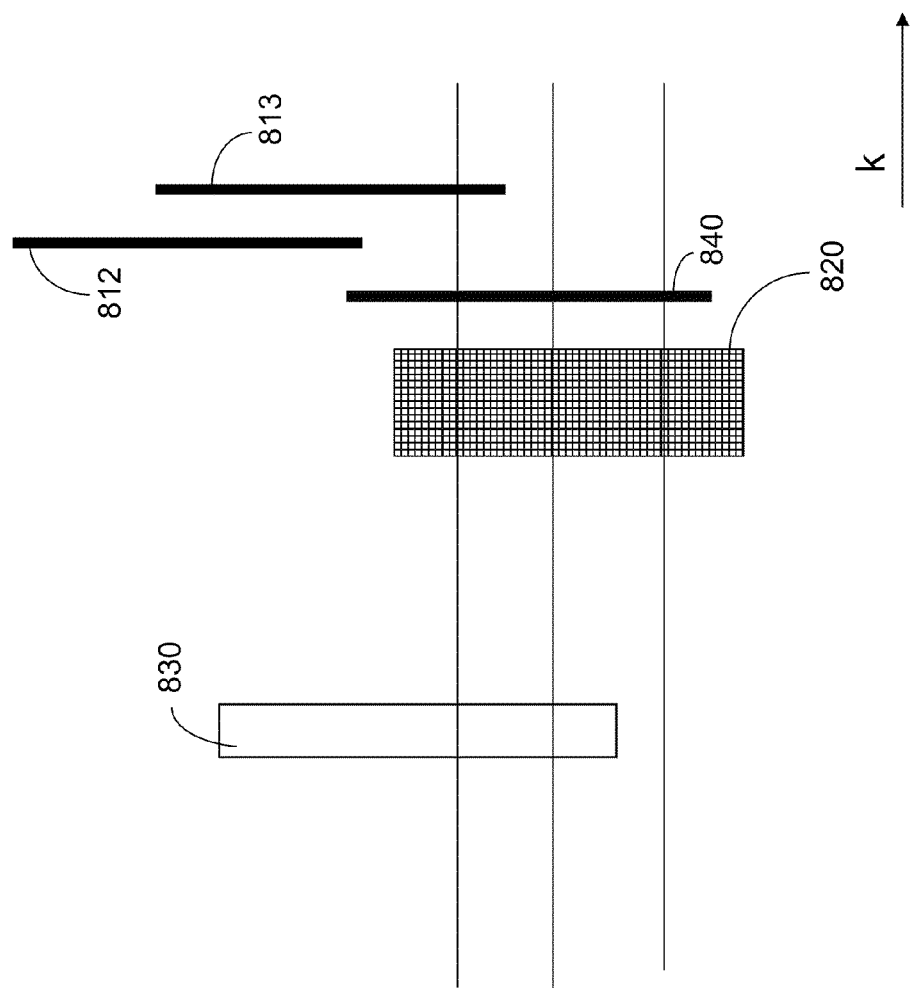

In accordance with FIG. 8, in a further embodiment, the retarder arrangement 830 can also have a photoelastic modulator. Photoelastic modulators (PEM) are optical components which are produced from a material exhibiting stress birefringence in such a way that excitation of the PEM to effect acoustic oscillations leads to a periodically changing mechanical stress and thus to a temporally varying retardation. Such photoelastic modulators are known in the prior art e.g. from U.S. Pat. No. 5,886,810 A1 or U.S. Pat. No. 5,744,721 A1 and are produced and sold for use at wavelengths of visible light through to the VUV range (approximately 130 nm) e.g. by Hinds Instruments Inc., Hillsboro, Oreg. (USA).

The crystal material of the PEM is caused to effect oscillations in this case typically via an electrical voltage being applied to piezoelectric contacts fitted to the crystal material of the PEM, wherein the pulse frequency of the laser can be tuned e.g. to the frequency of the applied electrical voltage such that a laser pulse impinges on the PEM in each case at the maximum of the retardation. In this embodiment, the retarder arrangement is thus electrically switchable since the magnitude of the maximum of the half-wave of the retardation can be set by way of the electrical voltage applied to the piezoelectric contacts and thus the amplitude of the oscillation of the crystal material in the PEM. Furthermore, analogously to the embodiment from FIGS. 5A, 5B, the retarder arrangement 830 having the photoelastic modulator can also be configured such that it is movable in a plane perpendicular to the light propagation direction (and in particular in two mutually perpendicular directions, e.g. x- and y-directions in the plane).

Figure 9:
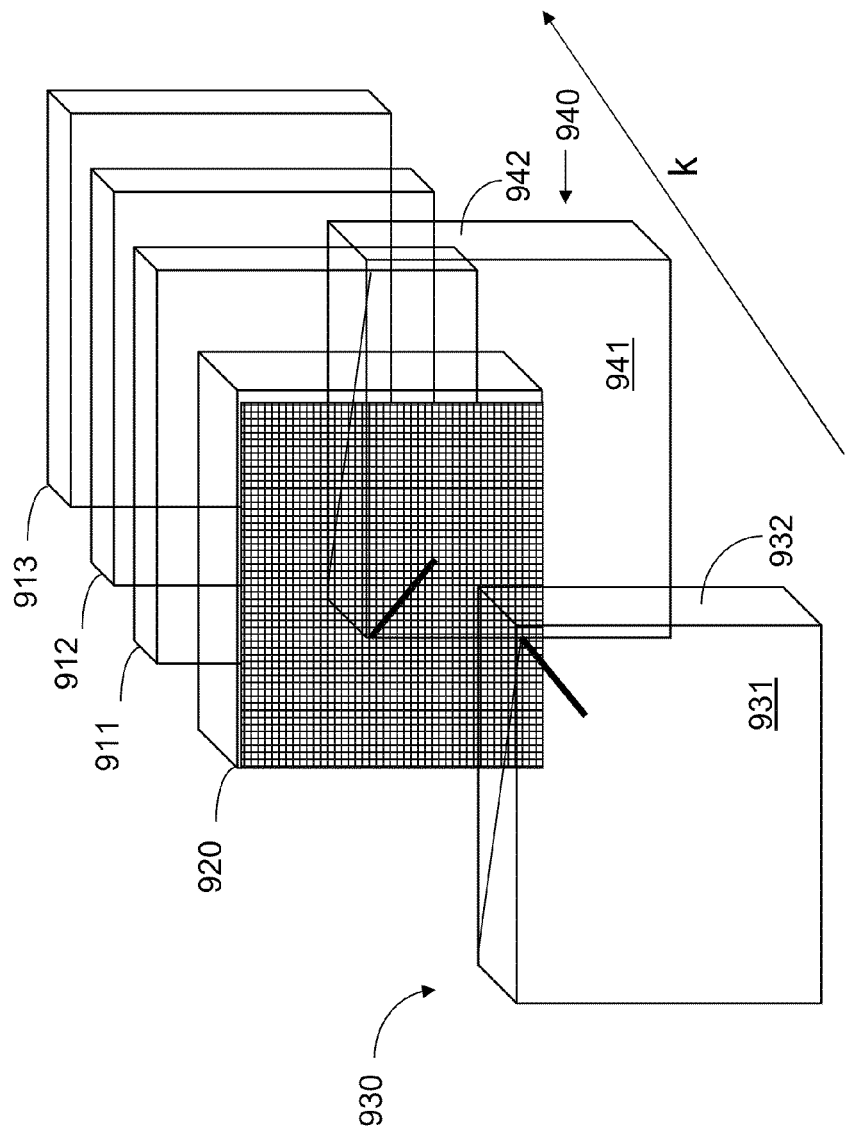

FIG. 9 shows a perspective illustration of an arrangement analogous to FIGS. 7A, 7B. In this case, in the exemplary embodiment illustrated, the double wedge arrangements 930 and 940 have mutually different orientations of the fast axis, the orientations of the fast axes in accordance with FIG. 9 being at an angle of +45° and −45° with respect to the input polarization (running in the y-direction). On account of this orientation of the fast axes and the furthermore provided movability of the double wedge arrangements 930, 940 in the x- and y-directions, to a first approximation arbitrary system retardation distributions can be compensated for, in principle.

The orientation of the fast axes as illustrated in FIG. 9 is advantageous in particular when the two retarder components of the retarder arrangement that are movable independently of one another are not embodied as double wedge arrangements (as in FIG. 9), but rather as plane-parallel birefringent plates, since it is thereby possible, in a simple manner, to set different signs of the retardation via the retarder arrangements (which can also be effected via setting the respective effective thickness in the case of double wedge arrangements).

Figure 10:
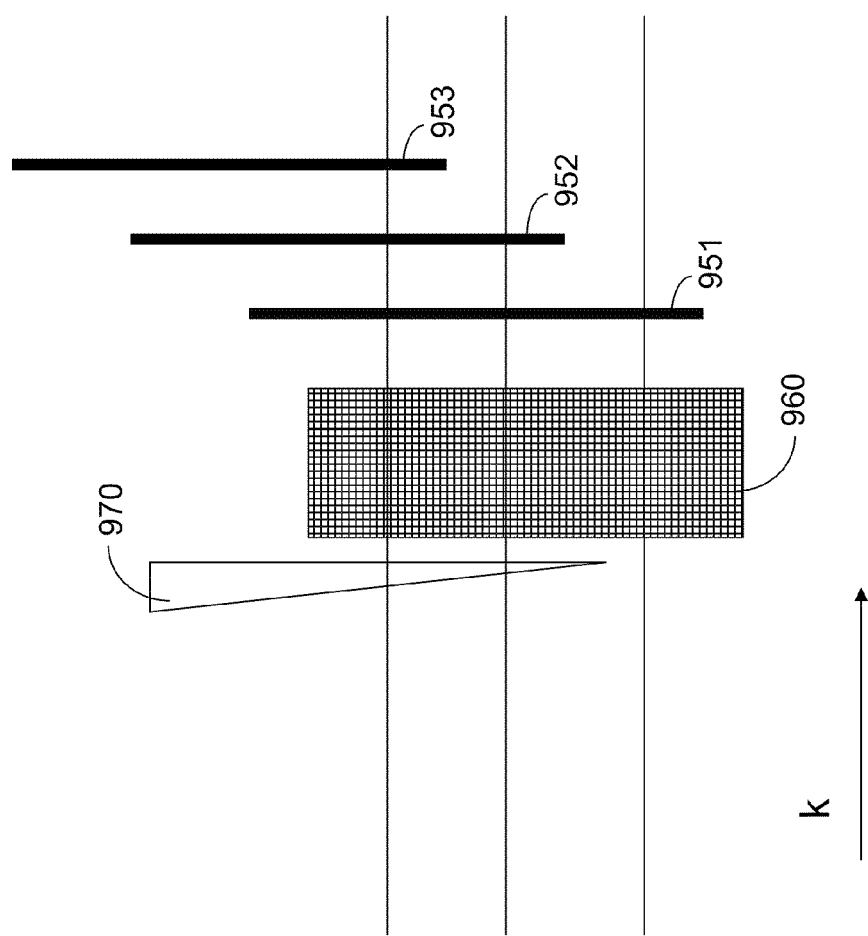

In accordance with FIG. 10, a retarder arrangement 970 according to the invention (instead of a double wedge arrangement composed of two partial elements that are displaceable relative to one another, as in the previous exemplary embodiments) can also have only a single partial element (in which case, of course, the section of the wedge that tapers to a point can also once again be omitted, that is to say that only a wedge section is present). This embodiment is based on the consideration that a beam offset introduced by such an individual wedge element can also be compensated for via suitable tilting of the mirror elements of the mirror arrangement 960 (i.e. can be kept available by the setting of the mirror elements). In this case, care should be taken to ensure that the distance between the wedge element forming the retarder arrangement 970 and the mirror arrangement 960 is chosen to be small enough that the beam offset does not have the effect that the light ray/beam no longer or no longer completely impinges on the corresponding mirror element of the mirror arrangement 960. The embodiment from FIG. 10 has the advantage in this case that the linearly rising profile of the retardation produced, the profile arising along the wedge element forming the retarder arrangement 970, can be used to compensate for continuous variations of the undesirable system retardation occurring within the pupil plane.

Even though the invention has been described on the basis of specific embodiments, numerous variations and alternative embodiments are evident to the person skilled in the art, e.g. through combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An optical system configured so that, during use of the optical system, a beam of light passes through the optical system along a path, the optical system comprising:
    a mirror arrangement comprising a plurality of mirror elements which are adjustable independently of each other to vary an angular distribution of the light reflected by the mirror arrangement;
    a retarder arrangement configured to at least partly compensate for a disturbance of a polarization distribution that is present outside the optical system; and
    a polarization influencing optical arrangement downstream of the retarder arrangement, the polarization-influencing optical arrangement configured to set different polarization states over a cross-section of the light beam; and
    wherein the polarization influencing optical arrangement comprises optical components which are adjustable in their relative position with respect to each other to change an output polarization distribution of the light.

2. The optical system of claim 1, wherein the optical system is configured to be used in a microlithographic projection exposure apparatus, and the disturbance of the polarization distribution is present in the microlithographic projection exposure apparatus.

3. The optical system of claim 1, wherein the optical components are adjustable relative to each other with a variable degree of overlap in a direction along the path.

4. The optical system of claim 1, wherein the polarization influencing optical arrangement comprises optical components which are adjustable in their relative position with respect to each other to set different polarization rotation angles of a preferred direction of polarization of light passing through the polarization influencing element.

5. The optical system of claim 4, wherein the different polarization rotation angles correspond to an integral multiple of 22.5°.

6. The optical system of claim 1, wherein the optical components comprise lambda/2 plates.

7. The optical system of claim 1, wherein the optical components comprise optically active material.

8. The optical system of claim 1, wherein the optical components comprise crystalline quartz having an optical crystal axis parallel to the light propagation direction.

9. The optical system of claim 1, wherein the retarder arrangement is adjustable to vary the retardation provided by the retarder arrangement during use of the optical system.

10. The optical system of claim 9, wherein the retarder arrangement comprises a component, and adjusting the retarder arrangement comprises displacing the component of the retarder arrangement within a plane perpendicular to a direction along the path.

11. The optical system of claim 10, wherein adjusting the retarder arrangement comprises displacing the component of the retarder arrangement in two mutually perpendicular directions in the plane.

12. The optical system of claim 8, wherein adjusting the retarder arrangement comprises rotating a component of the retarder arrangement about a rotation axis parallel to a direction of the path.

13. The optical system of claim 8, wherein the variation of the retardation provided by the retarder arrangement comprises a variation of the sign of the retardation.

14. The optical system of claim 1, wherein the retarder arrangement comprises two retarders which are movable independently of each other within a plane perpendicular to a direction of the path.

15. The optical system of claim 14, wherein the two retarders are movable independently of each other in two mutually perpendicular directions in the plane.

16. The optical system of claim 1, wherein the retarder arrangement comprises a plane parallel plate.

17. The optical system of claim 1, wherein the retarder arrangement comprises an element in the form of a wedge section.

18. The optical system of claim 1, wherein the retarder arrangement comprises a double wedge arrangement which comprises two wedge elements displaceable relative to each other to vary an effective thickness of the double wedge arrangement.

19. The optical system of claim 1, wherein the retarder arrangement comprises a photoelastic modulator.

20. An apparatus, comprising:
    an illumination device comprising an optical system according to claim 1; and
    a projection lens,
    wherein the apparatus is a microlithographic projection exposure apparatus.

21. The apparatus of claim 20, wherein the projection lens also comprises an optical system, which comprises:
    a mirror arrangement comprising a plurality of mirror elements which are adjustable independently of each other to vary an angular distribution of the light reflected by the mirror arrangement;
    a retarder arrangement configured to at least partly compensate for a disturbance of a polarization distribution that is present outside the optical system; and
    a polarization influencing optical arrangement downstream of the retarder arrangement, the polarization-influencing optical arrangement configured to set different polarization states over a cross-section of the light beam,
    wherein the polarization influencing optical arrangement comprises optical components which are adjustable in their relative position with respect to each other to change an output polarization distribution of the light.

22. An apparatus, comprising:
an illumination device; and
a projection lens comprising an optical system according to claim 1,
wherein the apparatus is a microlithographic projection exposure apparatus.

23. A method of using a microlithographic projection exposure apparatus which comprises an illumination device and a projection lens, the method comprising:
using the illumination device to illuminate structures of a mask; and
using the projection lens to project at least a part of the illuminated structures of the mask onto a light-sensitive material,
wherein the illumination device comprises an optical system according to claim 1.

24. The method of claim 23, wherein the projection lens also comprises an optical system, which comprises:
a mirror arrangement comprising a plurality of mirror elements which are adjustable independently of each other to vary an angular distribution of the light reflected by the mirror arrangement;
a retarder arrangement configured to at least partly compensate for a disturbance of a polarization distribution that is present outside the optical system; and
a polarization influencing optical arrangement downstream of the retarder arrangement, the polarization-influencing optical arrangement configured to set different polarization states over a cross-section of the light beam,
wherein the polarization influencing optical arrangement comprises optical components which are adjustable in their relative position with respect to each other to change an output polarization distribution of the light.

25. A method of using a microlithographic projection exposure apparatus which comprises an illumination device and a projection lens, the method comprising:
using the illumination device to illuminate structures of a mask; and
using the projection lens to project at least a part of the illuminated structures of the mask onto a light-sensitive material,
wherein the projection lens comprises an optical system according to claim 1.

* * * * *